US009478392B2

(12) United States Patent
Ikeda et al.

(10) Patent No.: US 9,478,392 B2
(45) Date of Patent: Oct. 25, 2016

(54) CHARGED PARTICLE BEAM APPARATUS AND IMAGE GENERATION METHOD

(71) Applicant: Hitachi High-Technologies Corporation, Minato-ku, Tokyo (JP)

(72) Inventors: Kazuki Ikeda, Tokyo (JP); Wen Li, Tokyo (JP); Ryo Kadoi, Tokyo (JP); Hisaaki Kanai, Tokyo (JP); Hajime Kawano, Tokyo (JP); Hiroyuki Takahashi, Tokyo (JP); Makoto Suzuki, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/803,304

(22) Filed: Jul. 20, 2015

(65) Prior Publication Data
US 2016/0064182 A1     Mar. 3, 2016

(30) Foreign Application Priority Data

Aug. 27, 2014 (JP) .................................. 2014-172186

(51) Int. Cl.
| H01J 37/26 | (2006.01) |
| H01J 37/22 | (2006.01) |
| H01J 37/29 | (2006.01) |
| H01J 37/06 | (2006.01) |

(52) U.S. Cl.
CPC .............. *H01J 37/222* (2013.01); *H01J 37/06* (2013.01); *H01J 37/292* (2013.01); *H01J 2237/221* (2013.01); *H01J 2237/28* (2013.01)

(58) Field of Classification Search
USPC ................. 250/305, 306, 307, 309, 310, 311, 250/492.1, 492.3
See application file for complete search history.

(56) References Cited

U.S. PATENT DOCUMENTS

| 3,223,880 A * | 12/1965 | Harris ..................... H04N 5/228 315/12.1 |
| 2012/0267528 A1* | 10/2012 | Sakai ................... G03F 7/70466 250/307 |
| 2013/0343649 A1* | 12/2013 | Itai ........................ G06K 9/4647 382/170 |

FOREIGN PATENT DOCUMENTS

| JP | 04-332447 A | 11/1992 |
| JP | 2011-175811 A | 9/2011 |

* cited by examiner

*Primary Examiner* — Nicole Ippolito
(74) *Attorney, Agent, or Firm* — Miles & Stockbridge P.C.

(57) ABSTRACT

There is provided a charged particle beam apparatus radiating a charged particle beam to a specimen so as to acquire an image of the specimen, the charged particle beam apparatus including: a charged particle gun that generates the charged particle beam; an electron optical system that radiates the charged particle beam emitted from the charged particle gun onto a surface of the specimen so as to scan the surface of the specimen; a detecting unit that detects secondary electrons or reflection electrons emitted from the specimen, and converts the electrons into pulse signals; a pulse signal detecting circuit that detects time detecting information regarding time of the pulse signals converted by the detecting unit, and peak value detecting information regarding each peak value of the pulse signals; and an image processing unit that generates luminance gradation of the acquired image based on a time detecting signal and a peak value detecting signal of the pulse signals detected by the pulse signal detecting circuit.

10 Claims, 7 Drawing Sheets

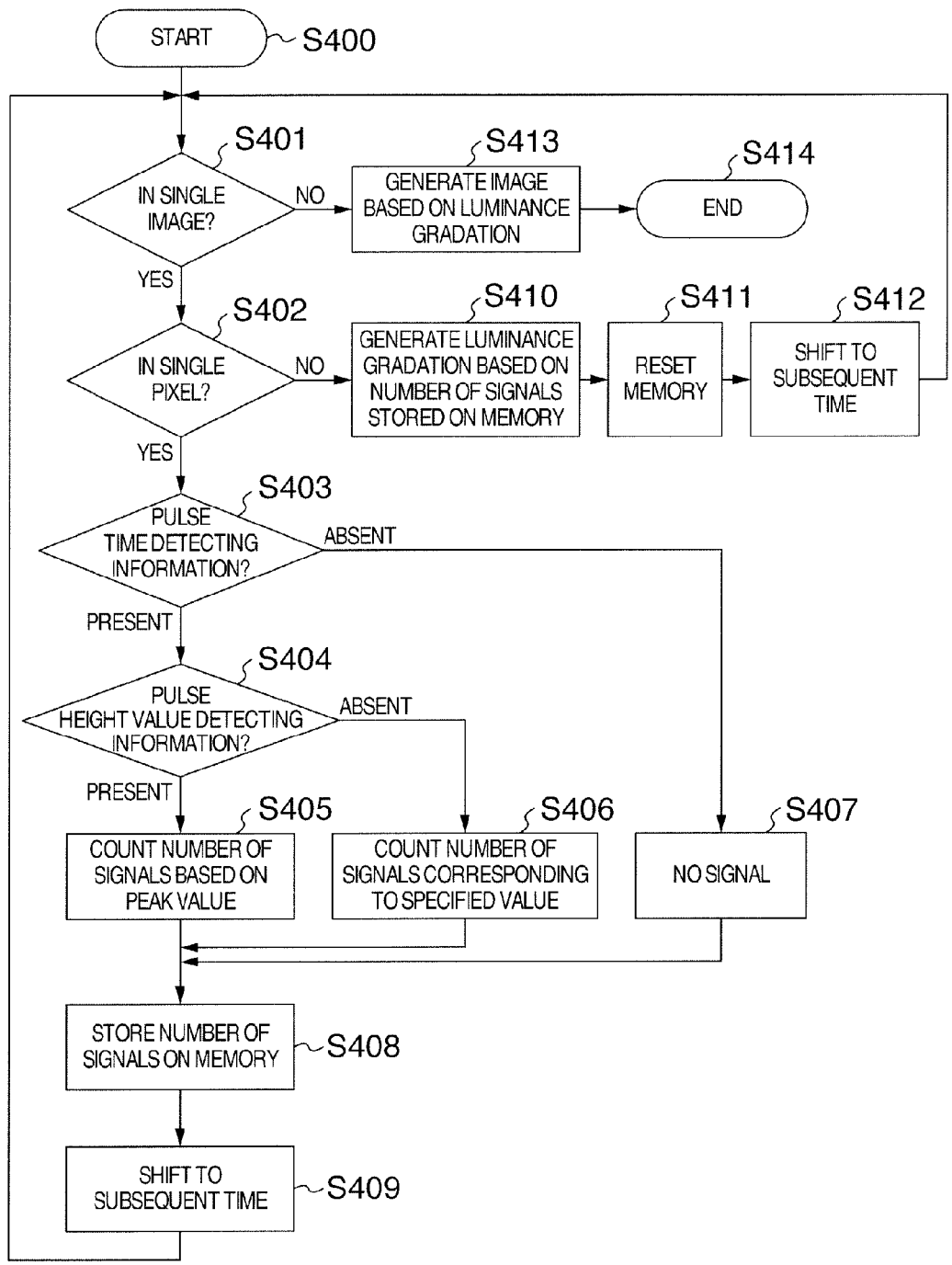

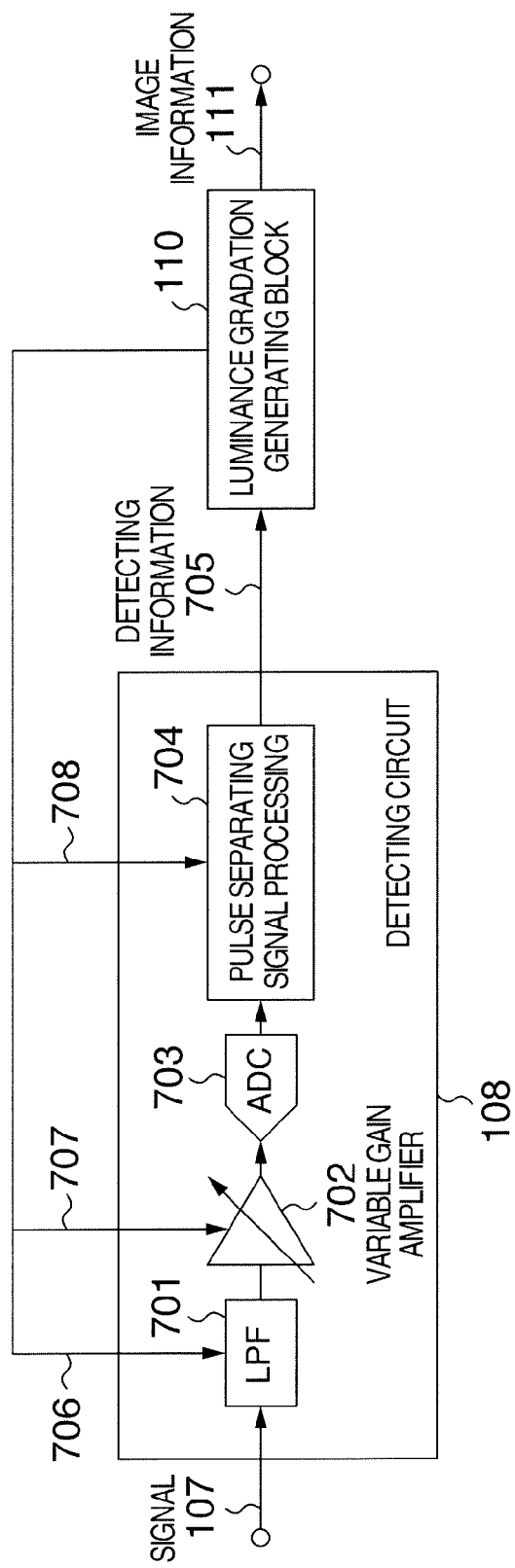

CHARGED PARTICLE BEAM APPARATUS AND IMAGE GENERATION METHOD

INCORPORATION BY REFERENCE

The present application claims priority from Japanese application JP2014-172186 filed on Aug. 27, 2014, the content of which is hereby incorporated by reference into this application.

BACKGROUND OF THE INVENTION

The present invention relates to a charged particle beam apparatus and an image generation method.

As related technologies pertinent to a pulse counting system, there are techniques described in JP-A-2011-175811 and JP-A-4-332447.

JP-A-2011-175811 describes "a charged particle beam apparatus including: a determining section that determines whether an output signal corresponds to an output signal in a state in which a single charged particle enters the detector, or corresponds to an output signal in a state in which plural charged particles enter the detector; and a calculating section that generates an image by signal processing using the pulse counting system if it is determined that the output signal corresponds to an output signal in a state in which a single charged particle enters the detector, or generates an image by analogue signal processing if it is determined that the output signal corresponds to an output signal in a state in which plural charged particles enter the detector."

JP-A-4-332447 describes that "if the pulse-counting electron detector is used in a scanning electron microscope or the like, it is configured to flexibly adjust contrast and brightness of an image. Subsequent to a pulse number counter 7, there are provided a multiplier 14 multiplying a counted value by any value and an adder 15 adding or subtracting any value to or from the counted value, or an input-output converting circuit having equivalent functions, and image data is generated using an output therefrom. This multiplier factor is controlled to be a value inversely proportional to a scanning speed, that is, time corresponding to a single pixel, and also set to be variable by using contrast and brightness adjusting means. It is possible to solve a problem particular to the pulse-counting system, that is, variation in data value depending on the scanning speed, thereby observing an image always having appropriate contrast in real time."

SUMMARY OF THE INVENTION

In a semiconductor manufacturing process, refinement of circuit patterns formed on semiconductor substrates (wafers) has been rapidly developed, and thus process monitoring that monitors, for example, whether or not these patterns are formed as a design has become more important. For example, in order to detect occurrence of abnormality and failures (defects) in a semiconductor manufacturing process at an earlier stage or previously, measurement and inspection on circuit patterns or the like formed on wafers are carried out at an end of each manufacturing step.

At the time of the above measurement and inspection, in a measurement inspection apparatus such as an electron microscope using a scanning electron beam system (SEM) and a measurement inspection method corresponding to this apparatus, an electron beam (electron ray) is radiated onto a target wafer (specimen) while scanning the target wafer, and energy of secondary electrons, reflection, and the like generated from the radiation is detected. Based on the detection, an image (a measurement image or an inspection image) is generated through signal processing, image processing, and the like, and measurement, observation, or inspection is carried out based on the image.

For example, in the case of an apparatus that inspects defects in a circuit pattern (an inspection apparatus, an inspection function), an inspection image is used to comparing images having similar circuit patterns with each other, and a portion having a great difference between them is determined and detected as a defect. In the case of an apparatus that performs measurement on a circuit pattern (a measurement apparatus, a measurement function), the occurrence of secondary electrons, reflection electrons, and others varies depending on the roughness (a surface shape) of the specimen, and thus change or the like in surface shape in the specimen can be grasped through evaluation processing of signals of the secondary electrons and others therefrom. In particular, making use of significant increase and decrease of signals of the secondary electrons and others at edge portions of the circuit pattern, the edge positions in the image of the circuit pattern can be estimated no as to measure dimensional values or the like of the circuit pattern. Based on the measurement result, it is possible to evaluate production quality or the like of this circuit pattern.

In the case of an apparatus (a review apparatus) that performs close observation on a defect detected by a different inspection apparatus, based on the positional coordinate of the defect detected by the different inspection apparatus, the position of the defect is detected by using a secondary electron image having a lower magnification, a magnified image of the defect is acquired using a secondary electron image having a higher magnification, and the defect is observed using this magnified image, and feature values on the image of the defect are extracted from the magnified image, and the defects are classified into defect categories.

An electron beam scanning system in a related measurement inspection apparatus such as a SEM, and a method of the same will be explained as follows. For example, normal scanning in a CD-SEM (a critical dimension SEM) is referred to as TV scanning, raster scanning, or the like. With reference to the TV scanning, scanning at a speed n times faster than a speed of the TV scanning is referred to as an n-times-speed scanning, or the like. In a related raster scanning system or a related TV scanning system, there is a problem that electric charge amount in a specimen varies depending on the scanning direction and the scanning speed of the electron beam, the shape of a pattern formed on the specimen, or the like. That is, in an image obtained by detecting secondary electrons, difference in electric charge amount in the specimen might cause deterioration of observation on the surface condition of the specimen, such as deterioration of image contrast or disappearance of edges of the circuit pattern, that is, deterioration of accuracy or impossibility of measurement and inspection.

To cope with the above deterioration of accuracy in measurement and inspection, it is effective to reduce radiation time of the electron beam per unit area, that is, reduce charge density of the radiation so as to decrease the electric charge amount of the specimen, or adjust the electric charge amount to be appropriate. For this purpose, it is effective to increase a speed of the electron beam radiation scanning by n times, that is, realize high speed scanning. However, due to decrease in charge density of the radiation with the above high-speed electron beam scanning, an occurrence frequency of the secondary electron, reflection electron, and the like to be generated from the specimen, that is, a detection frequency of the secondary electron and others becomes decreased.

As a detecting system of detecting secondary electrons, reflection electrons, and the like there are an analogue detecting system and a pulse counting system. The analogue detecting system is a system of converting secondary electrons and others into signals, and averaging these signals so as to detect a signal intensity. Meanwhile, the pulse counting system is a system of converting the secondary electrons and others into signals, and detecting the number of signals corresponding to the number of secondary electrons. To cope with decrease in an occurrence frequency of secondary electrons and others, the pulse counting system is effective for detecting secondary electrons and others with a lower occurrence frequency because this system can detect secondary electrons at a higher signal to noise ratio compared with that of the analogue detecting system.

In order to enhance visibility of a detection image or the like, an electron microscope of the pulse counting system is required to detect secondary electron, reflection electron, and others that occur at a lower frequency without omission. Particularly, under conditions of deep grooves, deep holes, high-speed scanning, and the like, the occurrence frequency of the secondary electron, reflection electron, and others becomes significantly decreased; therefore, there is a strong demand on improvement of visibility of a detection image and the like.

The pulse counting systems described in JP-A-2011-175811 and JP-A-4-332447 are a system that converts secondary electrons and others into signals, and thereafter, magnifies or controls intensities of the signals to detect these signals. In this system, there is a problem that, if plural secondary electrons and others sequentially occur in a short time, they are converted into plural continued signals, and thus the signals corresponding to the plural continued secondary electrons and others might be detected as a signal corresponding to a single secondary electron and others in error. This means that such a problem causes erroneous detection and detection omission of the secondary electrons and others, which deteriorates visibility of the detection images and the like.

An object of the present invention is to provide a technique to enhance visibility of a measurement inspection image in an inspection measurement apparatus.

In order to solve the aforementioned problems, plural solutions for the problems are included, and the following configurations are employed, for example.

In a charged particle beam apparatus, it is configured to include: a pulse time detecting circuit using differential circuits that separate and detect signals corresponding to plural continued secondary electrons and others derived from plural secondary electrons and others sequentially generated in a short time; and a pulse height value detecting circuit that detects signals corresponding to plural secondary electrons and others overlapping at the same time.

According to a representative aspect of the present invention, it is possible to enhance visibility of a measurement inspection image in the measurement inspection apparatus.

Other objects, features and advantages of the invention will become apparent from the following description of the embodiments of the invention taken in conjunction with the accompanying drawings.

BRIEF DESCRIPTION OF THE DRAWINGS

FIG. 4 shows an example of a flow chart explaining processing of an image processing unit of the embodiment 1;

FIG. 7 shows an example of a circuit configuration of an embodiment 3.

DETAILED DESCRIPTION OF THE EMBODIMENTS

Figure 1:
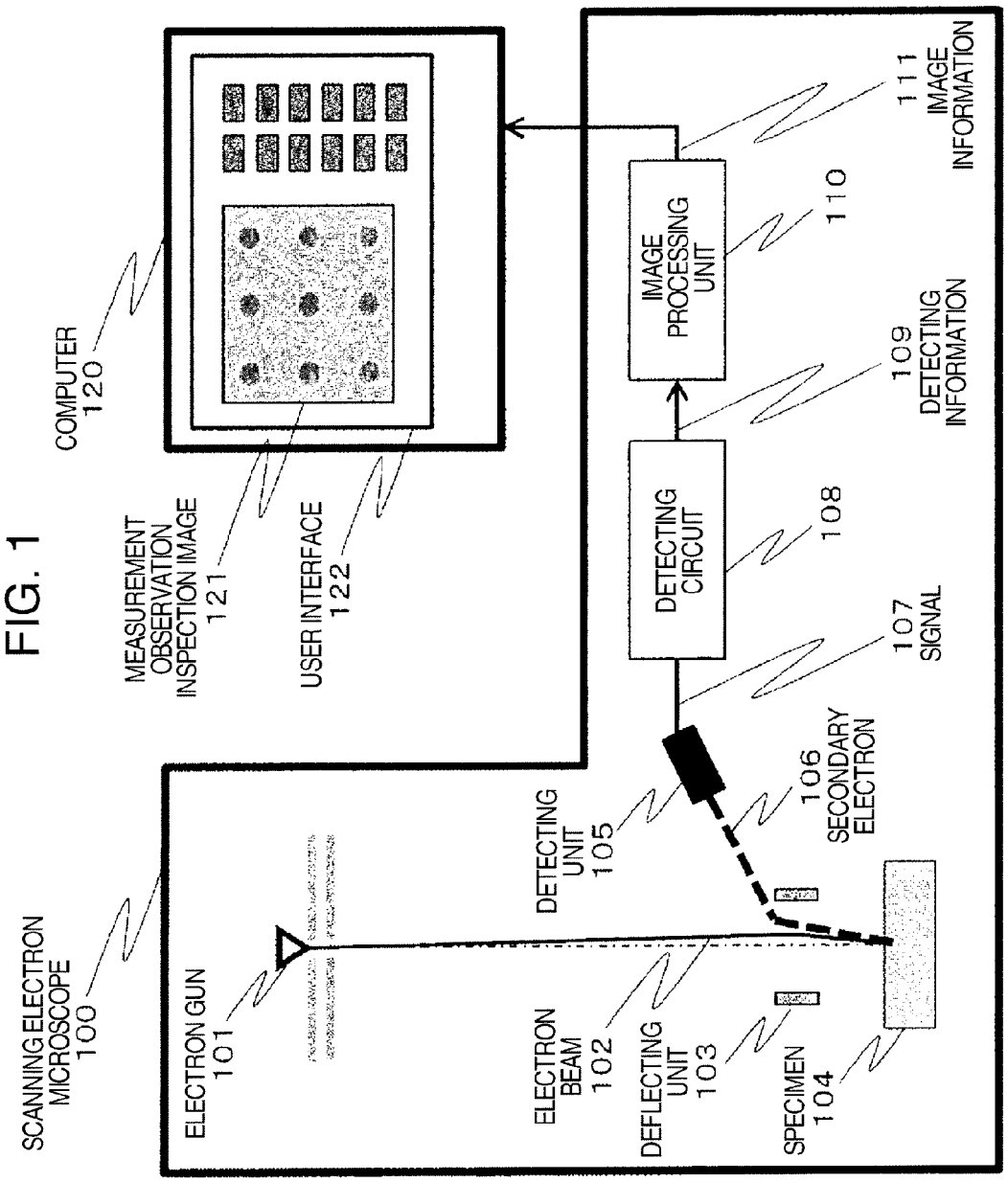
FIG. 1 shows an example of a measurement observation inspection apparatus using a scanning electron microscope.

Embodiments of the present invention will be described with reference to drawings, hereinafter. In all the drawings used for explaining the embodiments, the same reference numerals are basically used for common elements, and overlapping description thereof will be omitted. Hereinafter, a measurement observation inspection apparatus and a measurement observation inspection method may include any one of measurement, observation, and inspection, or various combinations thereof.

FIG. 1 shows an example (outline) of a measurement observation inspection apparatus using a scanning electron microscope. The measurement observation inspection apparatus includes a scanning electron microscope 100 and a computer 120. The scanning electron microscope 100 includes: an electron gun 101 radiating an electron beam 102; a deflecting unit 103 used for radiating the electron beam 102 for scanning; a specimen 104 that is a measurement observation inspection target; secondary electrons and others 106 generated from the specimen 104 by radiation of the electron beam 102; a detecting unit 105 converting the secondary electrons and others 106 into signals 107; a detecting circuit 108 detecting and counting the number of signals corresponding to the number of the secondary electrons and others 106 from the signals 107, and outputting detecting information 109; and an image processing unit 110 generating image information 111 based on the detecting information 109. The image information 111 for measurement observation inspection outputted from the image processing unit 110 is transmitted to the computer 120, and is displayed as a measurement observation inspection image 121 on a user interface display 122.

In embodiment 1, it is configured to include a pulse time detecting circuit using differential circuits for separating and detecting signals corresponding to plural continued secondary electrons and others derived from plural secondary electrons and others sequentially generated in a short time, and a pulse height value detecting circuit for detecting signals corresponding to plural secondary electrons and others overlapping at the same time, and this configuration will be explained.

Figure 2:
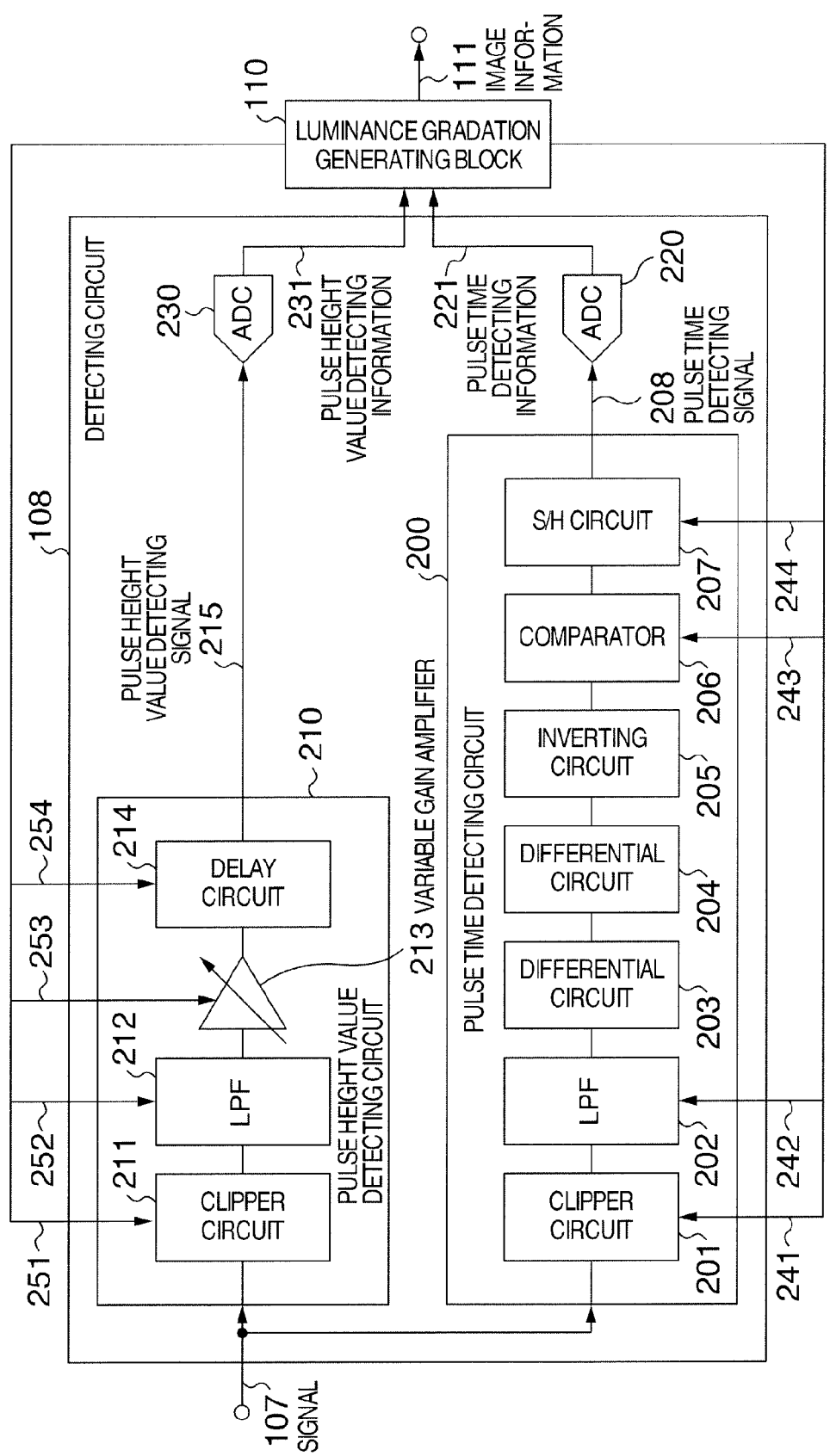
FIG. 2 shows an example of a circuit configuration of an embodiment 1.

FIG. 2 shows a configuration of the detecting circuit 108 in the present embodiment. The detecting circuit 108 includes: the pulse time detecting circuit 200; the pulse height value detecting circuit 210; and analogue to digital converters 220, 230, and outputs pulse time detecting information 221 and pulse height value detecting information 231. The image processing unit 110 generates the image information 111 based on the pulse time detecting information 221 and the pulse height value detecting information 231. The pulse time detecting circuit 200 includes: a clipper circuit 201; a low-pass filter (LPF) 202; differential circuits 203, 204; an inverting circuit 205; a comparator 206; and a sample hold circuit (S/H circuit) 207. The pulse height value detecting circuit 210 includes: a clipper circuit 211; a low-pass filter (LPF) 212; a variable gain amplifier 213; and a delay circuit 214.

Figure 3A:
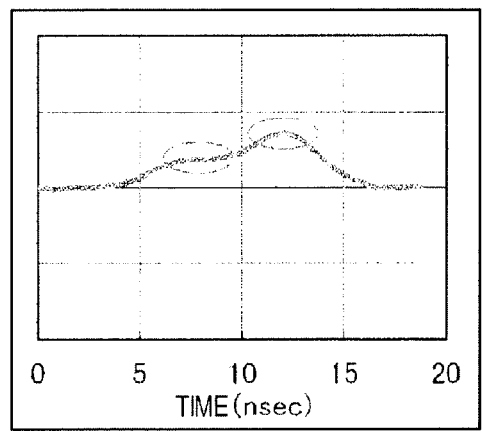
FIG. 3A shows a circuit simulation result of signals after passing through a low-pass filter 202 of the embodiment 1.
Figure 3B:
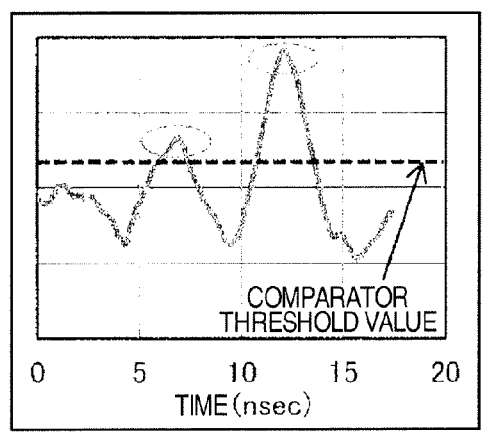
FIG. 3B shows a circuit simulation result of the signals after passing through an inverting circuit 205 of the embodiment 1.
Figure 3C:
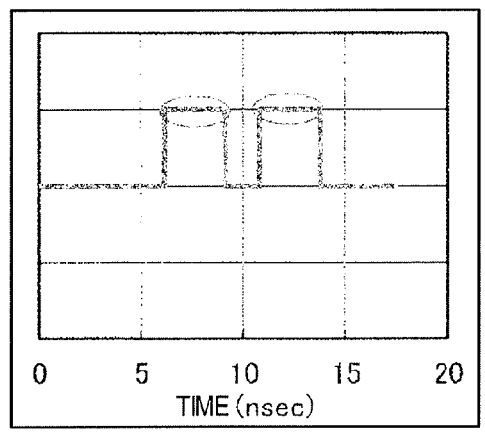
FIG. 3C shows a circuit simulation result of the signals after passing through a sample hold circuit 207 of the embodiment 1.

FIGS. 3 show circuit simulation results of the pulse time detecting circuit 200 into which signals derived from secondary electrons and others sequentially generated has been inputted; and hereinafter, the results will be explained along with an operating principle of a detecting circuit 128 as shown in FIG. 2. When the signals 107 are inputted into the pulse time detecting circuit 200, low-amplitude noise components of the signals are removed by the clipper circuit 201, and high-frequency noises of the signals are removed by the low-pass filter 202, thereby obtaining signals as shown in FIG. 3A. Subsequently, the signals are subjected to second order differential by the differential circuits 203, 204 and the inverting circuit 205 so as to be converted into change in temporal inclination of the signals, thereby obtaining signals as shown in FIG. 3B. This means that a portion having a moderate temporal inclination of the signals is extracted. In addition, in order to convert the signals into the pulse time detecting information 221, each magnitude of the signals is normalized by the comparator 206 in accordance with the analogue to digital converter 220, and retaining time is adjusted by the sample hold circuit 207, thereby obtaining signals as shown in FIG. 3C.

If the signals 107 derived from the secondary electrons and others sequentially generated are inputted into the pulse time detecting circuit 200, the pulse time detecting circuit 200 can separate the signals 107 into plural pulse signals, and output a pulse time detecting signal 208 having detecting information regarding time.

An operation principle of the pulse height value detecting circuit 210 will be explained. When the signals 107 are inputted into the pulse height value detecting circuit 210, low-amplitude noise components of the signals are removed by the clipper circuit 211, and high-frequency noises of the signals are removed by the low-pass filter 212, and thereafter, in order to convert the signals into the pulse height value detecting information 231, each amplitude of the signals is adjusted by the variable gain amplifier 213 in accordance with the analogue to digital converter 230, and delay amount is so adjusted by the delay circuit 214 as to have the same time as that of the pulse time detecting circuit 200.

Therefore, when the signals 107 derived from the plural secondary electrons and others generated at the same time are inputted into the pulse height value detecting circuit 210, the pulse height value detecting circuit 210 has amplitude information regarding the signals 107, and thus the pulse height value detecting circuit 210 can output a pulse height value detecting signal 215 having detecting information regarding the amplitude.

Operation of the image processing unit 110 will be explained. FIG. 4 shows a flow chart for generating the image information 111 based on the pulse time detecting information 221 and the pulse height value detecting information 231 while scanning with the electron beam 102. It is determined whether or not the electron beam is present in a single image and in a single pixel based on a scanning position of the electron beam 102 (S401 S402). If the electron beam is present in the single image and in the single pixel, the pulse time detecting information 221 is confirmed (S403), and if this information is information regarding absence of a detecting signal, it is determined that there is no signal, and the number of signals is counted as zero (S407), and if this information is information regarding presence of a detecting signal, the pulse height value detecting information 231 is confirmed (S404). If there is a detecting signal of the pulse height value detecting information 231, the number of signals is counted based on the information regarding the peak value (S405), and if there is no detecting signal, the number of signals corresponding to a preset specified value is counted (S406).

Subsequently, the number of signals that has been counted under each condition is stored on a memory (S408), and the operation shifts to subsequent time (S409). The above operation is repetitively carried out while the electron beam 102 is present in the same single pixel of interest. If the electron beam 102 deviates from the same single pixel of interest, the number of signals stored on the memory is read out so as to generate luminance gradation at a portion corresponding to the same single pixel of interest in the image information 111 (S410), the memory of a previous pixel is reset (S411), and then the operation shifts to subsequent time (S412).

The above operation is repetitively carried out while the electron beam is present in the same single image. If the electron beam deviates from the same single image, an image is generated based on the luminance gradation of each pixel (S413), and then generation of the image is completed (S414).

As aforementioned, the pulse time detecting information 221 and the pulse height value detecting information 231 can be used for generating the luminance gradation of the image information 111, thereby reflecting the number of secondary electrons and others to the image information 111.

In order to enhance visibility of the measurement observation inspection image 121, a brightness histogram (brightness distributions in the image) of the image information 111 is required to be optimized. In particular, because less secondary electrons, less reflection electrons, and less others are generated in the measurement observation inspection for a deep groove, a deep hole, or the like, if the brightness histogram is not optimized, the measurement observation inspection image generally appears dark, to become an image having low contrast, which exhibits poor visibility.

In the present embodiment a method of controlling each element of the detecting circuit 108 from the image processing unit 110 by using respective control signals 241, 242, 243, 244, 251, 252, 253, 254, thereby optimizing the brightness histogram of the image information 111 is described.

In order to optimize the brightness in the pulse time detecting circuit 200, the retaining time of the sample hold circuit 207 can be controlled by using the control signal 244 so as to expand or compress the signal in a time-axis direction. For example, if the brightness is low, the retaining time of the sample hold circuit 207 is set to be longer.

In addition, a threshold voltage of the clipper circuit 201 and a cut-off frequency of the low-pass filter 202 can be respectively controlled by using the control signal 241 and the control signal 242, thereby optimizing removal of the low-amplitude noise components and the high-frequency noises. For example, in the case of having more low-amplitude noises, the threshold voltage of the clipper circuit 201 is set to be higher by using the control signal 241 so as to remove the low-amplitude noises. In the case of having more high-frequency noises, the cut-off frequency of the low-pass filter 202 is set to be a lower frequency by using the control signal 242 so as to remove high-frequency noises.

A threshold voltage of the comparator 206 can be controlled by using the control signal 243, thereby optimizing separation of noises from the signals detected by the differential circuits 203, 204 and the inverting circuit 205. For example, in the case of having more noises, the threshold voltage of the comparator 206 is set to be higher by using the control signal 243 so as to remove the noises In order to optimize the brightness in the pulse height value detecting circuit 210, an amplification factor of the variable in amplifier 213 can be controlled by using the control signal 253, thereby increasing or decreasing the amplitude of the signal. For example, in the case of having a lower brightness, the amplification factor of the variable gain amplifier 213 is set to be higher. In order to adjust the pulse time detecting signal 208 to be synchronized with the pulse height value detecting signal 215, delay time of the delay circuit 214 is controlled by using the control signal 254.

Furthermore, a threshold voltage of the clipper circuit 211 and a cut-off frequency of the low-pass filter 212 can be respectively controlled by using the control signal 251 and the control signal 252, thereby optimizing the removal of the low-amplitude noise components and the high-frequency noises. For example, in the case of having more low-amplitude noises, the threshold voltage of the clipper circuit 211 is set to be higher by using the control signal 251 so as to remove the low-amplitude noises. In the case of having more high-frequency noises, the cut-off frequency of the low-pass filter 212 is set to be a lower frequency by using the control signal 252 so as to remove high-frequency noises. Hence, each element of the detecting circuit 108 can be controlled so as to optimize the brightness histogram of the image information 111, thereby enhancing the visibility of the measurement observation inspection image 121.

As aforementioned, according to the present embodiment, with the pulse time detecting circuit 200 and the pulse height value detecting circuit 210, it is possible to detect the number of secondary electrons and others from the signals 107 derived from plural continued secondary electrons and others and plural secondary electrons and others overlapping at the same time, and also possible to suppress detection omission and erroneous detection of the secondary electron and others. In addition, the pulse time detecting circuit 200 and the pulse height value detecting circuit 210 can be controlled so as to generate the image information 111 based on the pulse time detecting information 221 and the pulse height value detecting information 231, thereby enhancing the visibility of the measurement observation inspection image 121.

In embodiment 2, for the purpose of simplifying and downsizing the detecting circuit, it is configured to eliminate the respective analogue to digital converters used in the pulse time detecting circuit 200 and the pulse height value detecting circuit 210 in the embodiment 1, but include a multiplier and an analogue to digital converter, and this configuration will be explained.

Figure 5:
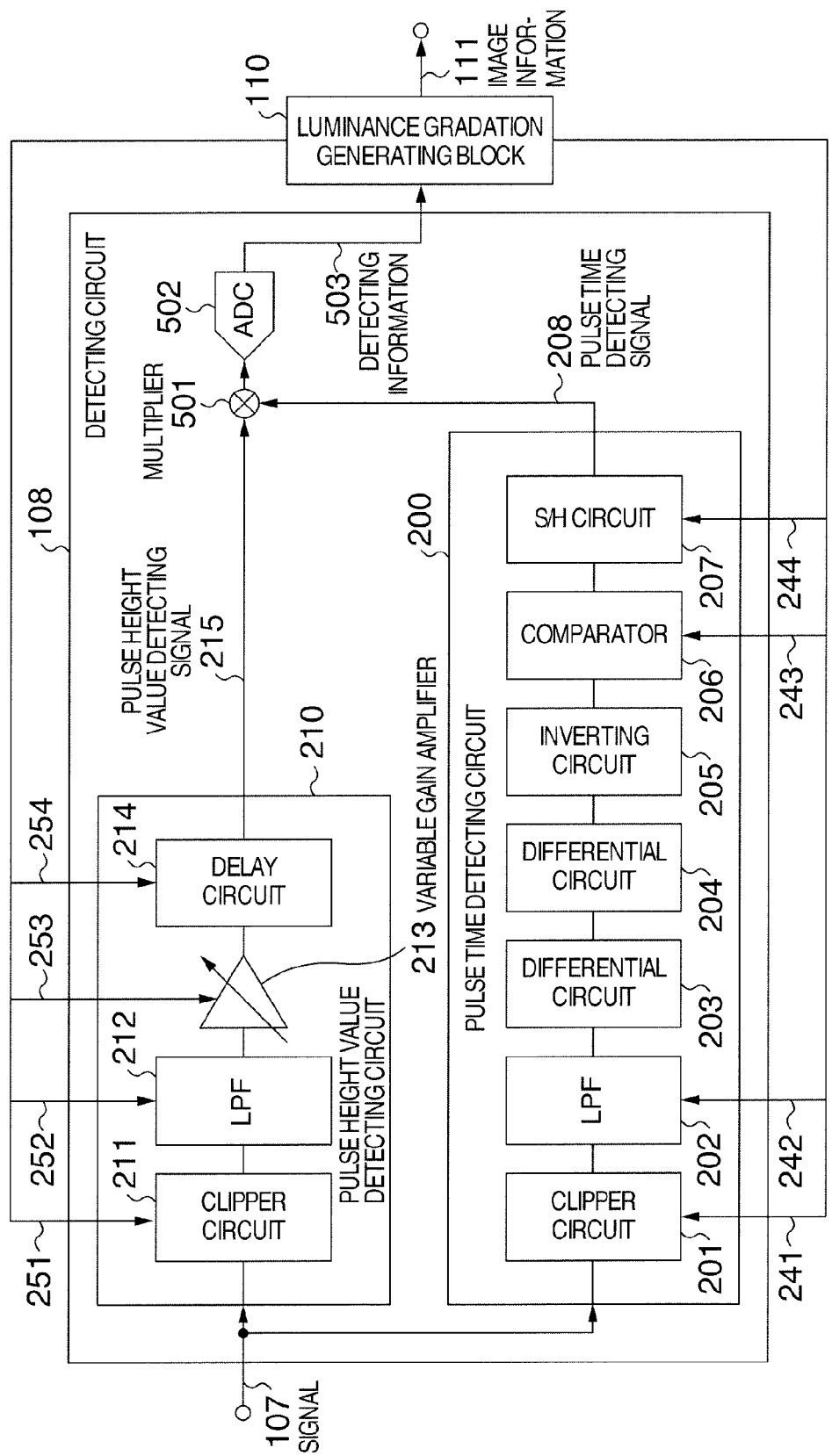
FIG. 5 shows an example of a circuit configuration of an embodiment 2.

FIG. 5 shows a configuration of the detecting circuit 108 in the present embodiment. The detecting circuit 108 includes: the pulse time detecting circuit 200; the pulse height value detecting circuit 210; a multiplier 501; and an analogue to digital converter 502, and outputs detecting information 503. The image processing unit 110 generates the image information based on the detecting information 503. Each configuration, operational principle, and control method of the pulse time detecting circuit 200 and the pulse height value detecting circuit 210 are the same as those in the embodiment 1; therefore, descriptions thereof will be omitted.

In the present embodiment, the signals 107 are inputted through the pulse time detecting circuit 200 and the pulse height value detecting circuit 210 to be generated into the pulse time detecting signal 208 having detecting information regarding time and a pulse height value detecting signal 215 having detecting information regarding amplitude, and thereafter are converted through the multiplier 501 and the analogue to digital converter 502 into the detecting information 503 having information regarding time and amplitude of the signals 107, and then outputted.

The detecting circuit 108 in the present embodiment can therefore detect the signals 107 derived from plural secondary electrons and others sequentially generated in a short time and plural secondary electrons and others generated at the same time by using the single analogue to digital converter 502.

Figure 6:
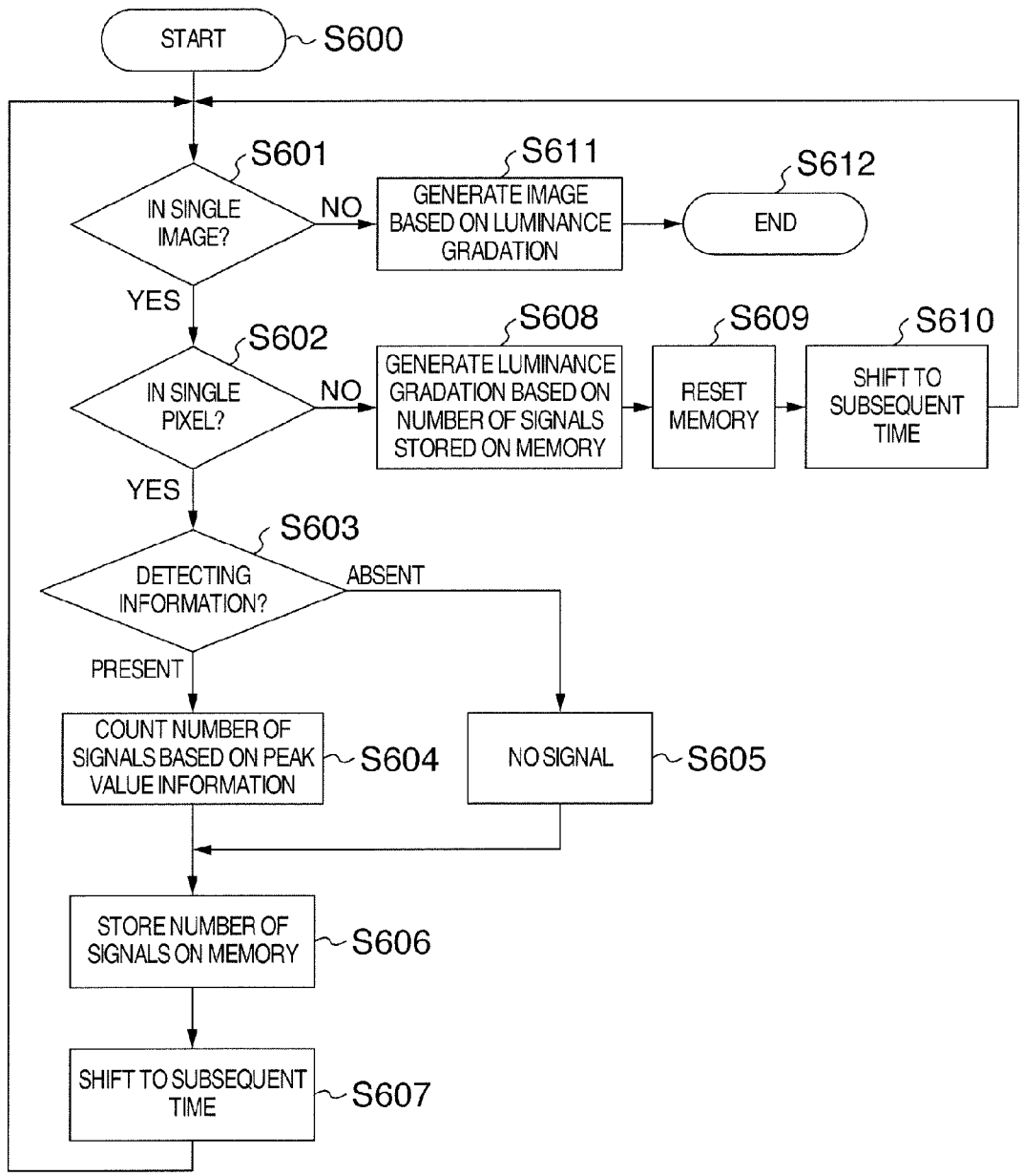
FIG. 6 shows an example of a flow chart explaining processing of an image processing unit of the embodiment 2.

Operation of the image processing unit 110 in the present embodiment will be described. FIG. 6 shows a flow chart used for generating the image information 111 based on the detecting information 503 while scanning with the electron beam 102.

It is determined whether or not the electron beam is present in a single image and in a single pixel based on the scanning position of the electron beam 102 (S601, 8002). If it is determined that the electron beam is present in the single image and in the single pixel, the detecting information 503 is confirmed (S603); and if this information is information regarding absence of a detecting signal, it is determined that there is no signal, and the number of signals is counted as zero (S605), and if this information is information regarding presence of a detecting signal, the number of signals is counted based on the information regarding the peak value (S604).

Subsequently, the number of signals that has been counted under each condition is stored on the memory (S606), and the operation shifts to subsequent time (S607). The above operation is repetitively carried out while the electron beam 102 is present in the same single pixel of interest. If the electron beam 102 deviates from the same single pixel of interest, the number of signals stored on the memory is read out so as to generate luminance gradation at a portion corresponding to the same single pixel of interest in the image information 111 (S608), the memory of a previous pixel is reset (S609), and then the operation shifts to subsequent time (S610). The above operation is repetitively carried out while the electron beam is present in the same single image. If the electron beam deviates from the same single image, an image is generated based on the luminance gradation of each pixel (S611), and then generation of the image is completed (S612).

The detecting information 503 having information regarding time and amplitude can be used for generating the luminance gradation of the image information 111, thereby reflecting the number of secondary electrons and others to the image information 111, thus enhancing the visibility of the measurement observation inspection image 121.

As aforementioned, according to the present invention, with the pulse time detecting circuit 200 and the pulse height value detecting circuit 210, it is possible to detect the number of the secondary electrons and others from the signals 107 derived from plural continued secondary electrons and others and plural secondary electrons and others overlapping at the same time by using a single analogue to digital converter, and thus it is possible to simplify and downsize the detecting circuit 108. In addition, the image information 111 can be generated based on the detecting information 503 having information regarding time and amplitude, thereby enhancing the visibility of the measurement observation inspection image 121.

In embodiment 3, in order to simplify and downsize the detecting circuit, it is configured to include an analogue to digital converter having a highly-accurate and high-speed sampling ability, and a pulse separating signal processing that performs digital signal processing, and this configuration will be explained.

FIG. 7 shows a configuration of the detecting circuit 108 in the present embodiment. The detecting circuit 108 includes: a low-pass filter (LPF) 701; a variable gain amplifier 702; an analogue to digital converter 703; and a pulse separating signal processing 704, and outputs detecting information 705. The image processing unit 110 generates the image information 111 based on the detecting information 705.

In the present embodiment, when the signals 107 are inputted into the detecting circuit 108, high-frequency noises are removed by the low-pass filter 701, and thereafter, the amplitude is adjusted by the variable gain amplifier 702 in accordance with the analogue to digital converter 703. Through the analogue to digital converter 703 capable of sampling at a sufficiently high speed for a band of the signals 107 and having a reproduction accuracy sufficient for reproducing the signals 107, analogue wave forms of the signals 107 are converted into digital signals, and processed into information having information regarding time and amplitude by the pulse separating signal processing 704, and is then outputted as the detecting information 705. At this time, the pulse separating signal processing 704 separates the continued signals of the signals 107 through digital signal processing, such as second order differences, wavelet conversion, and pattern matching, and generates the detecting information 705 along with a signal having amplitude information.

Accordingly, the detecting circuit 108 in the present embodiment can separate and detect the signals corresponding to plural continued secondary electrons and others through the analogue to digital converter 703 capable of sampling at a high speed with high accuracy and the pulse separating signal processing 704 that performs digital signal processing.

In the present embodiment, in order to enhance the visibility of the measurement observation inspection image 121, there is provided a method of controlling each element of the detecting circuit 108 from the image processing unit 110 by using respective control signals 706, 707, 708, thereby optimizing the brightness histogram of the image information 111, and this method will be explained. The brightness histogram of the image information is generated based on the number of signals in the detecting information 705, and thus the pulse separating signal processing 704 can be controlled by using the control signal 708 so as to increase or decrease information regarding the number of signals in each pixel of the detecting information 705, thereby optimizing the brightness histogram. This processing corresponds to the processing of expanding or compressing of the detecting signal in the brightness histogram optimization in the embodiment 1 in the time-axis direction, and increasing or decreasing of the amplitude of the detecting signal. In addition, the cut-off frequency of the low-pass filter 701 and the amplification factor of the variable gain amplifier 702 can be respectively controlled by using the control signal 706 and the control signal 707 so as to optimize removal of high-frequency noises as well as the input signal into the analogue to digital converter 703. Accordingly, it is possible to optimize the brightness histogram of the image information 111 by controlling the pulse separating signal processing 704, thus enhancing the visibility of the measurement observation inspection image 121.

As aforementioned, according to the present embodiment, it is possible to detect through digital processing the number of the secondary electrons and others from the signals 107 derived from plural continued secondary electrons and others and plural secondary electrons and others overlapping at the same time through the analogue to digital converter 703 capable of sampling at a high speed with high accuracy as well as the pulse separating signal processing 704 that performs the digital signal processing, and it is possible to simplify and downsize the detecting circuit 108. The pulse separating signal processing 704 can be controlled so as to generate the image information 111 based on the detecting information 705, thereby enhancing the visibility of the measurement observation inspection image 121.

The present invention is not limited to the aforementioned embodiments, and may include various variations. For example, the above mentioned embodiments have been explained in details for the sake of providing an easily understandable explanation of the present invention, and the present invention is not limited to a case that includes all the configurations that have been explained. Part of configurations of one embodiment may be replaced with configurations of another embodiment, or configurations of one embodiment may be added configurations of another embodiment. Part of configurations of each embodiment may be added, deleted from, or replaced with other configurations. Part or all of the aforementioned respective configurations, functions, processing units, processing means, and others may be embodied by hardware such that they are designed by using integrated circuits, for example. Each of the aforementioned configurations, functions, and others may be embodied by software in which programs that realize respective functions are interrupted and executed by a processor. Information such as programs, tables, and files that realize respective functions may be stored on a recording device, such as a memory, a hard disk, and an SSD (Solid State Drive), or a recording medium, such as an IC card, an SD card, and a DVD.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A charged particle beam apparatus radiating a charged particle beam to a specimen so as to acquire an image of the specimen, the charged particle beam apparatus comprising:
a charged particle gun that generates the charged particle beam;
an electron optical system that radiates the charged particle beam emitted from the charged particle gun onto a surface of the specimen so as to scan the surface of the specimen;

a detecting unit that detects secondary electrons or reflection electrons emitted from the specimen, and converts the electrons into pulse signals;

a pulse signal detecting circuit that detects time detecting information regarding time of the pulse signals converted by the detecting unit, and peak value detecting information regarding each peak value of the pulse signals; and an image processing unit that generates luminance gradation of the acquired image based on a time detecting signal and a peak value detecting signal of the pulse signals detected by the pulse signal detecting circuit.

2. The charged particle beam apparatus according to claim 1, wherein
the image processing unit controls a gain or a threshold value of the pulse signal detecting circuit based on the generated luminance gradation.

3. The charged particle beam apparatus according to claim 1, wherein
the pulse signal detecting circuit comprises:
a time detecting circuit that detects each time of the pulses from the pulse signals, and generates a time detecting signal; and
a peak value detecting circuit that detects each peak value of the pulses from the pulse signals, and generates a peak value detecting signal, and
the time detecting circuit includes differential circuits subjecting the pulse signals to second order differential.

4. The charged particle beam apparatus according to claim 1, further comprising:
a first analogue to digital converting circuit that converts the peak value detecting signal into peak value detecting information; and
a second analogue to digital converting circuit that converts the time detecting signal into time detecting information,
wherein
the peak value detecting information and the time detecting information that are respectively converted by the first analogue to digital converting circuit and the second analogue to digital converting circuit are inputted into the image processing unit.

5. The charged particle beam apparatus according to claim 1, further comprising:
a multiplier that multiplies the peak value detecting signal and the time detecting signal; and
an analogue to digital converting circuit that converts the signal multiplied by the multiplier into detecting information,
wherein
the detecting information converted by the analogue to digital converting circuit is inputted into the image processing unit.

6. The charged particle beam apparatus according to claim 5, wherein
the image processing unit detects presence or absence of the detecting information in a first pixel of the image that is being acquired,
if the detecting information is present, the number of signals is counted based on the pulse height value information, and
luminance gradation of the first pixel is generated based on the counted number of signals.

7. The charged particle beam apparatus according to claim 1, wherein
the image processing unit detects presence or absence of the pulse time detecting information in a first pixel of the image that is being acquired,
if the pulse time detecting information is present, presence or absence of the pulse height value information is detected,
if the pulse height value information is present, the number of signals is counted based on the pulse height value information,
if the pulse height value information is absent, the predetermined number of signals is counted,
and
luminance gradation of the first pixel is generated based on the counted number of signals.

8. An image generation method in a charged particle beam apparatus radiating a charged particle beam to a specimen so as to acquire an image of the specimen,
the image generation method comprising:
a step of scanning a surface of a specimen by radiating the charged particle beam to the surface of the specimen;
a step of detecting secondary electrons or reflection electrons generated from the specimen, and converting the secondary electrons or the reflection electrons into pulse signals,
a step of generating time detecting information regarding each time of the converted pulse signals, and peak value detecting information regarding each peak value of the pulse signals; and
a step of generating luminance gradation of the image that is being acquired based on the time detecting information and the peak value detecting information of the detected pulse signals.

9. The image generation method according to claim 8, wherein
in the step of generating the luminance gradation,
presence or absence of the pulse time detecting information in a first pixel of the image that is being acquired is detected,
if the pulse time detecting information is present, presence or absence of the pulse height value information is detected,
if the pulse height value information is present, the number of signals is counted based on the pulse height value information,
if the pulse height value information is absent, the predetermined number of signals is counted,
and
luminance gradation of the first pixel is generated based on the counted number of signals.

10. The image generation method according to claim 8, further comprising:
a step of multiplying the peak value detecting signal and the time detecting signal; and
a step of converting the signal multiplied by a multiplier into detecting information,
wherein
in the step of generating the luminance gradation, presence or absence of the detecting information in a first pixel of the image that is being acquired is detected,
if the detecting information is present, the number of signals is counted based on the pulse height value information,
and
luminance gradation of the first pixel is generated based on the counted number of signals.

* * * * *